United States Patent
Kashiwakura

(10) Patent No.: US 9,532,442 B2
(45) Date of Patent: Dec. 27, 2016

(54) FEED LINE STRUCTURE, CIRCUIT BOARD USING SAME, AND EMI NOISE REDUCTION METHOD

(75) Inventor: Kazuhiro Kashiwakura, Tokyo (JP)

(73) Assignee: NEC CORPORATION, Tokyo (JP)

( * ) Notice: Subject to any disclaimer, the term of this patent is extended or adjusted under 35 U.S.C. 154(b) by 760 days.

(21) Appl. No.: 13/387,566

(22) PCT Filed: Jun. 17, 2010

(86) PCT No.: PCT/JP2010/004038
§ 371 (c)(1),
(2), (4) Date: Jan. 27, 2012

(87) PCT Pub. No.: WO2011/021339
PCT Pub. Date: Feb. 24, 2011

(65) Prior Publication Data
US 2012/0120617 A1    May 17, 2012

(30) Foreign Application Priority Data
Aug. 19, 2009    (JP) ................. 2009-189633

(51) Int. Cl.
H05K 1/18    (2006.01)
H05K 1/02    (2006.01)
H05K 1/16    (2006.01)

(52) U.S. Cl.
CPC ............ *H05K 1/0228* (2013.01); *H05K 1/162* (2013.01); *H05K 2201/09236* (2013.01); *H05K 2201/09245* (2013.01); *H05K 2201/09781* (2013.01)

(58) Field of Classification Search
CPC .................................... H05K 1/0236
USPC .. 361/760–764, 767–785, 803; 716/103–120
See application file for complete search history.

(56) References Cited

U.S. PATENT DOCUMENTS

| | | | | |
|---|---|---|---|---|
| 5,838,582 A | * | 11/1998 | Mehrotra et al. | 716/115 |
| 6,305,000 B1 | * | 10/2001 | Phan et al. | 716/120 |
| 6,438,735 B1 | * | 8/2002 | McElvain et al. | 716/103 |
| 6,483,714 B1 | * | 11/2002 | Kabumoto et al. | 361/760 |
| 6,795,335 B2 | | 9/2004 | Hidaka | |
| 7,240,314 B1 | * | 7/2007 | Leung | 257/773 |
| 8,050,044 B2 | * | 11/2011 | Chen | H05K 1/0236 |
| | | | | 361/760 |
| 8,350,375 B2 | * | 1/2013 | Ali et al. | 257/691 |
| 2003/0081450 A1 | | 5/2003 | Hidaka | |

(Continued)

FOREIGN PATENT DOCUMENTS

JP    6-005375    1/1994
JP    2001-339169    12/2001

(Continued)

OTHER PUBLICATIONS

International Search Report, PCT/JP2010/004038, Aug. 24, 2010.

*Primary Examiner* — Tuan T Dinh
(74) *Attorney, Agent, or Firm* — Young & Thompson

(57) ABSTRACT

Provided is a feed line structure that enables suppression of noise entering a primary power supply from an electronic circuit without using a circuit component such as a choke coil and a capacitor and also without increasing an occupied area on the circuit board, so that an EMI countermeasure is achieved. The feed line structure includes a feed line composed by pairing a power supply wire 41 and a reference potential wire 42 in an insulator 40, and is characterized in that a wire 43 in a floating state in potential is provided.

4 Claims, 8 Drawing Sheets

(56) References Cited

U.S. PATENT DOCUMENTS

2004/0251535 A1* 12/2004 Nagata et al. ................ 257/691
2009/0152595 A1* 6/2009 Kaga .................. G01R 31/2884
                                                              257/208

FOREIGN PATENT DOCUMENTS

JP      2003-204044     7/2003
JP      2008-198761     8/2008

* cited by examiner

FEED LINE STRUCTURE, CIRCUIT BOARD USING SAME, AND EMI NOISE REDUCTION METHOD

TECHNICAL FIELD

The present invention relates to a feed line structure, a circuit board using same, and an EMI noise reduction method, and particularly to a feed line structure, a circuit board using same, and an EMI noise reduction method that enable a suppression countermeasure against EMI (Electro-Magnetic Interference) noise.

BACKGROUND ART

A general example of the suppression countermeasure against EMI noise is explained with reference to FIG. 8. Note that in FIG. 8, a case of communication devices, such as a switch, an IP (Internet Protocol) switch, and a router, is shown.

A station power supply or a commercial power supply 1 is supplied to a product and device 3, which is a communication device, via an external feed cable 2. In the product and device 3, supply power is supplied to a power supply circuit 6 via a filter circuit 5, and further, supplied to an electronic circuit board (printed circuit board) 4 as an operation power supply of an electronic circuit 12, which is mounted on the electronic circuit board (printed circuit board) 4, via an internal feed line 7 and an internal feed connector 8.

A plurality of electronic circuits 12, an onboard power supply 11, and a filter circuit 9 are mounted on this electronic circuit board 4.

Usually, a power supply voltage supplied via the power supply circuit 6 from the station power supply or the commercial power supply 1 is different from a voltage required by the electronic circuit 12, and referred to as a primary power supply. This primary power supply is made to be a voltage necessary for an operation of the electronic circuit 12 by the onboard power supply 11, and is supplied to the electronic circuit 12. The power supply supplied to the electronic circuit 12 is referred to as a secondary power supply here.

The primary power supply is supplied to an input unit of the onboard power supply 11 via a primary side feed line 10 from the internal feed connector 8, and the secondary power supply is supplied to each electronic circuit 12 via a secondary side feed line 13 from an output unit of the onboard power supply 11.

Generally, the primary power supply and the secondary power supply are electrically separated, so that high frequency noise 102a by the operation of the electronic circuit supplied by the secondary power supply does not propagate to the primary power supply.

However, by electromagnetic coupling of the primary side power supply wire 10 and the secondary side power supply wire 13 and coupling inside the onboard power supply 11, the high frequency noise 102a generated in the electronic circuit 12 enters the primary power supply (indicated by high frequency noise 102b and 102c), and EMI noise (EMI radiation) 101 is generated via the internal feed line 7 and the external feed cable 2. Therefore, the filter circuit 9 such as a capacitor and a common mode choke coil is inserted along the primary side feed line 10, and this high frequency noise is suppressed.

Note that as an example of such filter circuit using an impedance element, there are PTL 1 and 2.

Moreover, with reference to PTL 3, a technique is disclosed that by enlarging an area of an overlapping part (a plurality of parts) of a power supply wire disposed in a first layer and a reference potential (ground: GND) wire disposed in a second layer that compose the feed line on the circuit board, an apparent capacity is attempted to increase and the EMI noise is suppressed.

CITATION LIST

Patent Literature

PTL 1: Japanese Unexamined Patent Application Publication No. H06-005375
PTL 2: Japanese Unexamined Patent Application Publication No. 2008-198761
PTL 3: Japanese Unexamined Patent Application Publication No. 2001-339169

SUMMARY OF INVENTION

Technical Problem

In the technique of providing the filter circuit 9 shown in FIG. 8, and the techniques of PTL 1 and 2, it is necessary to mount a filter component on the circuit board, which leads to a difficulty in the implementation of the circuit, thereby generating a cause to prevent reduction of a size of a device, and also it is not the best plan in terms of the cost. Further, in the technique of PTL 3, as each area of the overlapping part of the power supply wire and the reference potential wire is enlarged, an occupied area on the circuit board increases, and there is another difficulty in the implementation of the circuit.

A purpose of the present invention is to provide a feed line structure, a circuit board using same, and an EMI noise reduction method that enable suppression of the noise entering the primary power supply from the electronic circuit to achieve an EMI countermeasure without using a circuit component such as a choke coil and a capacitor and also without increasing the occupied area on the circuit board.

Solution to Problem

A feed line structure according to the present invention includes a power supply wire and a reference potential wire that pair and compose a feed line and are provided in a dielectric, and a wire that is provided to three-dimensionally intersect with both of the power supply wire and the reference potential wire in the dielectric and in a floating state in potential.

A circuit board according to the present invention includes an electronic circuit, a power supply circuit that supplies power supply to the electronic circuit, a power supply wire and a reference potential wire that compose a feed line of an input side of the power supply circuit, and a wire in a floating state in potential that is provided to three-dimensionally intersect with both of the power supply wire and the reference potential wire.

An EMI noise reduction method according to the present invention includes in a dielectric, forming a power supply wire and a reference potential wire that pair and compose a feed line, and a wire in a floating state in potential to three-dimensionally intersect with both of the power supply wire and the reference potential wire, and supplying power supply to an electronic circuit provided on the dielectric via the power supply wire and the reference potential wire.

Advantageous Effects of Invention

According to the present invention, by including the wire across the power supply wire and the reference potential wire in the primary feed line, characteristic impedance of the feed line is partly reduced and negative reflection is generated in the noise propagating on the feed wire, thus there is an exemplary advantage of enabling suppression of the noise propagation without using a circuit component.

DESCRIPTION OF EMBODIMENTS

Figure 1:
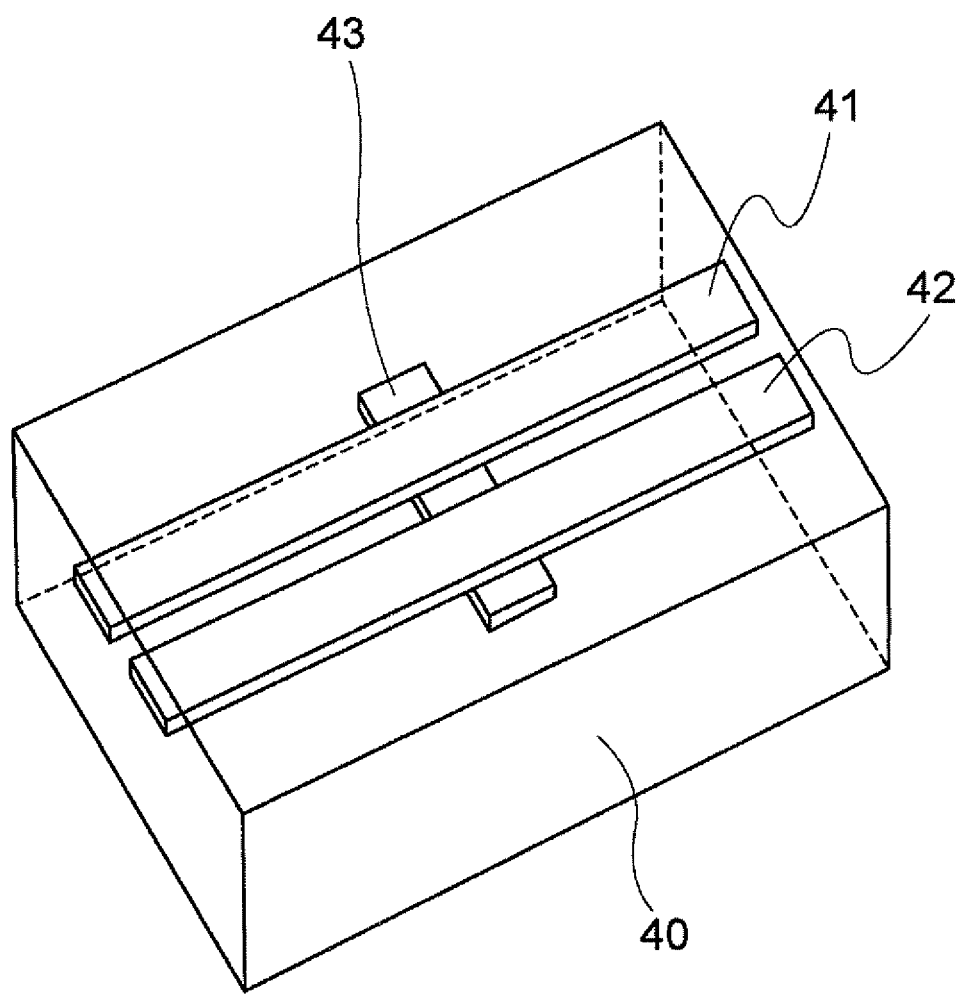
FIG. 1 is a perspective view of a first exemplary embodiment of the present invention.
Figure 2:
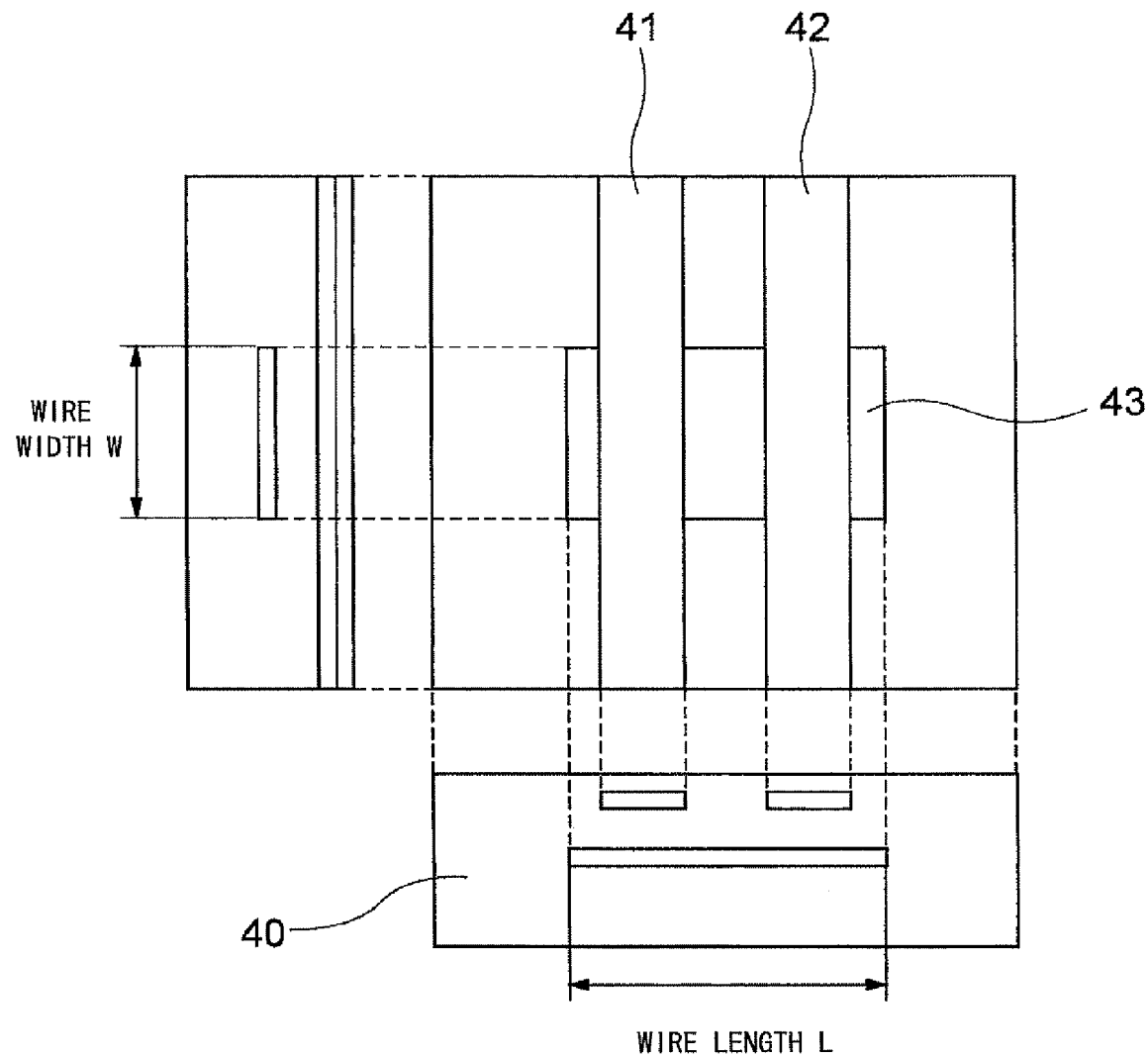
FIG. 2 is a plan view, a front view, and a side view of the first exemplary embodiment of the present invention.

An exemplary embodiment of the present invention is described in detail with reference to the drawings. FIGS. 1 and 2 are views showing the first exemplary embodiment of the present invention. FIG. 1 is a perspective view thereof, and FIG. 2 is a plan view, a front view, and a side view thereof. Note that in FIGS. 1 and 2, a state in which a part of an insulator (dielectric) 40 as a circuit board is cut off is shown. In this case, in order to understand easily, it is shown that the dielectric 40 is assumed to be a transparency for convenience.

Figure 8:
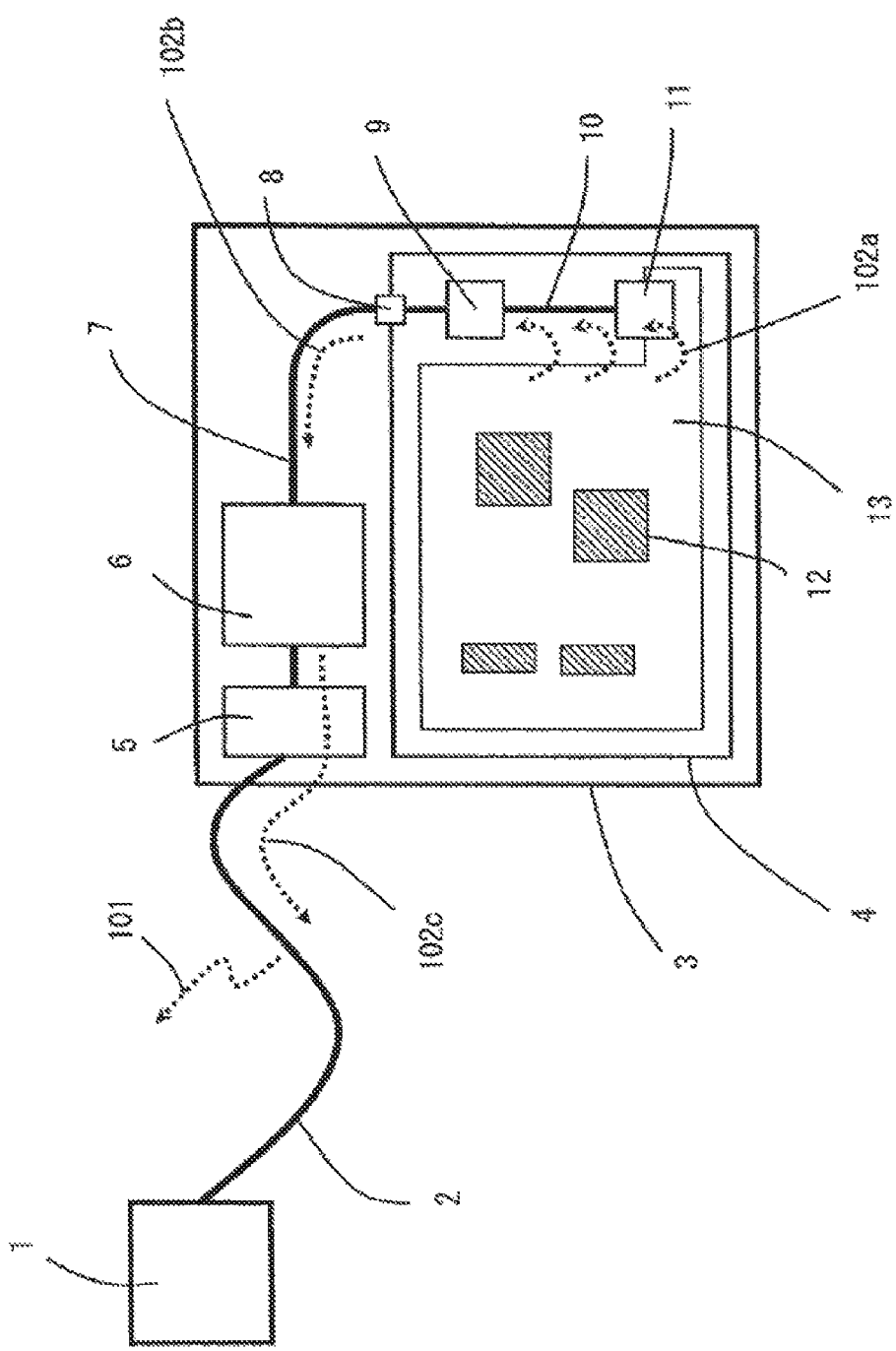
FIG. 8 is a view for explaining a technique relevant to the present invention.

In this example, in a certain layer in a multilayer printed circuit board (indicated as the dielectric 40), that is, in the same plane, the power supply wire 41 and the reference potential (GND) wire 42 are provided in parallel. By these power supply wire 41 and the reference potential wire 42, the primary feed line 10 explained with FIG. 8 is composed. FIGS. 1 and 2 show a magnification of a part thereof.

Note that in this example, for convenience of explanation, the power supply wire 41 and the reference potential wire 42 are parallel, and it is needless to say that they are not necessarily parallel as long as a feed line is composed. In the present invention, a "wire 43" is provided to overlap across both of this feed lines, which are the power supply wire 41 and the reference potential wire 42. This wire 43 shall be in a state of floating in potential which is not connected to anything. Accordingly, the wire 43 is referred to as a floating wire 43.

This floating wire 43 is formed as an inner surface inside the dielectric in a different surface from the surface where the power supply wire 41 and the reference potential wire 42 are formed, and to three-dimensionally intersect with both of them.

Figure 3:
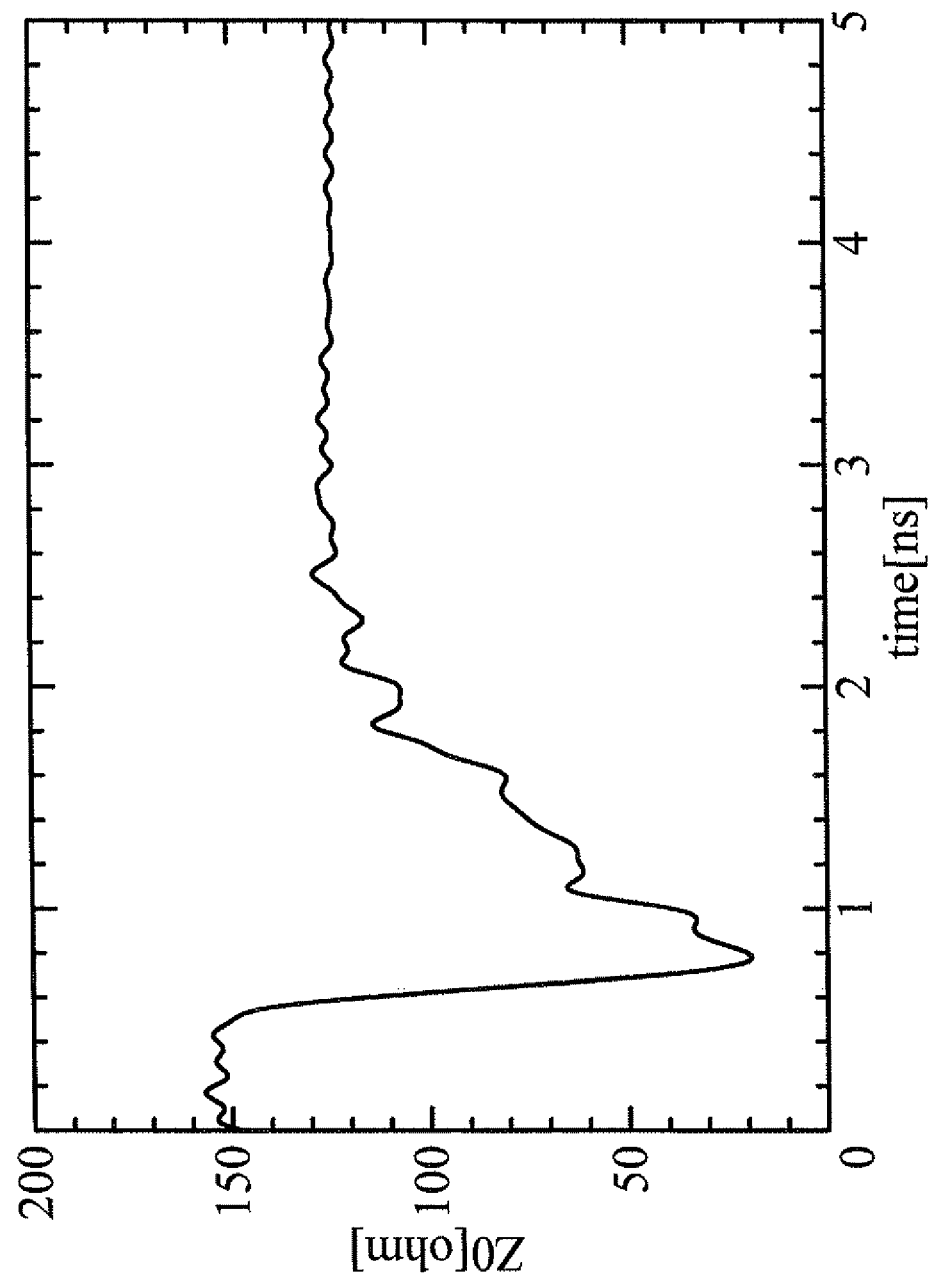
FIG. 3 is a view showing TDR (Time Domain Reflectometry) characteristics in the examples of FIGS. 1 and 2.

FIG. 3 shows the TDR (Time Domain Reflectometry) characteristics of the power supply line shown in FIG. 1 and FIG. 2. As described so far, by providing the floating wire 43 along the feed wire, it can be confirmed that a low impedance region is formed along the feed line.

When a mismatch of the characteristic impedance is generated in the transmission line, in the propagation from the transmission line of the characteristic impedance Z1 to the transmission line of the characteristic impedance Z2, Reflection coefficient=(Z2−Z1)/(Z2+Z1)

is satisfied. In the feed line shown in FIGS. 1 and 2, Z2 corresponds to the part where the floating wire 43 provided across, and it is indicated that this reflection coefficient is negative.

Specifically, by providing the structure of the feed line shown in FIGS. 1 and 2 along the primary feed line 10 (in place of the filter circuit 9 in FIG. 8) of the onboard power supply 11 in FIG. 8, when the high frequency noise 102a generated from the electronic circuit 12 in FIG. 8 propagates the feed line, negative reflection is generated in the part where this floating wire 43 is provided, and it does not reach the feed cables 7 and 2 ahead thereof. The above is the theory of operation of the present invention.

Figure 4:
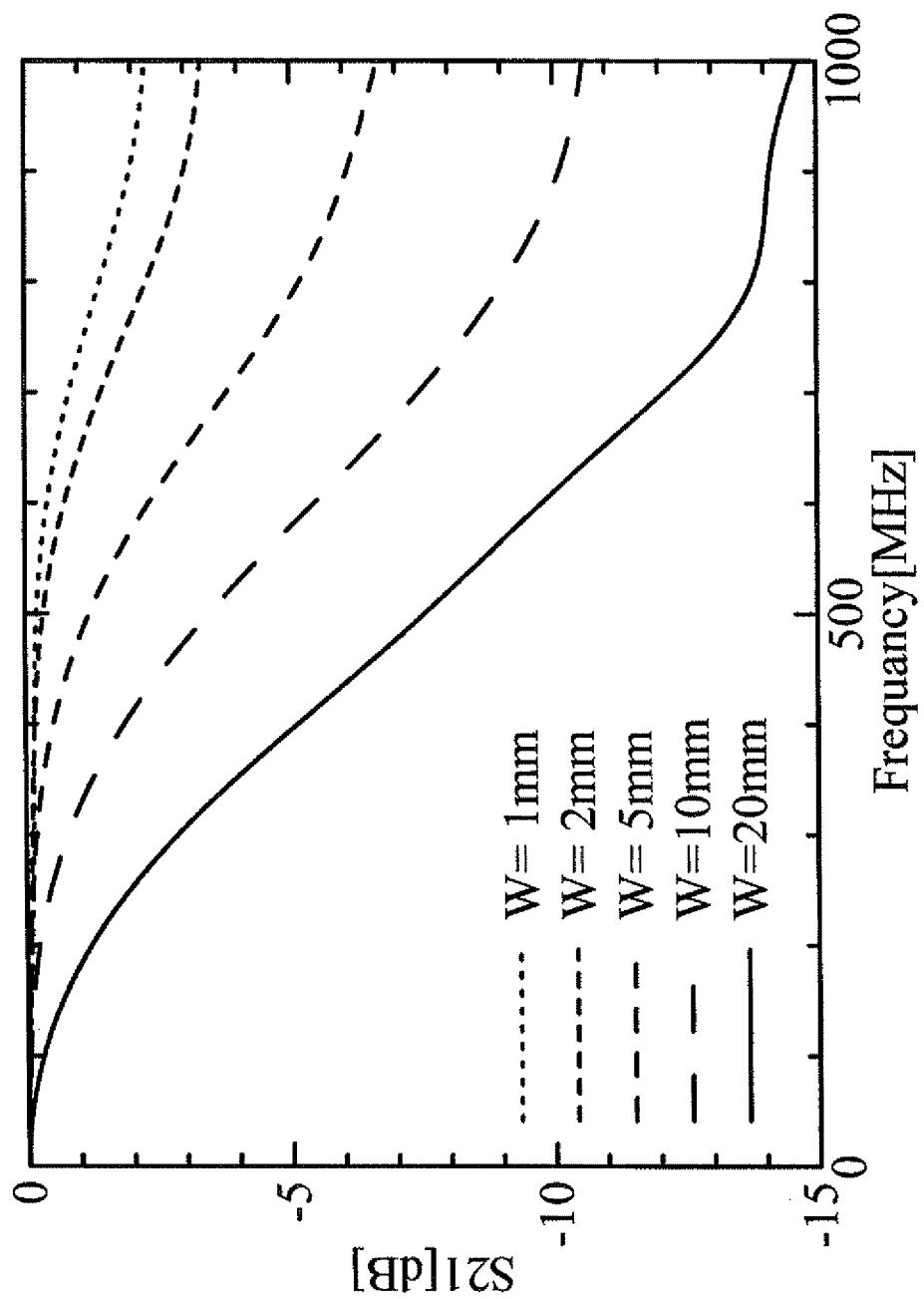
FIG. 4 is a view showing insertion loss characteristics when changing a width of a floating wire in the example of FIGS. 1 and 2.

Further, characteristics of the abovementioned feed line according to the present invention are disclosed. FIG. 4 shows insertion loss (S21) characteristics when changing a width W of the floating wire 43. It can be seen that by controlling the wire width W in this way, the cutoff frequency of the feed line can be controlled.

For example, in VCCI (Voluntary Control Council for Information Technology Equipment), the radiation field strength of EMI is targeted for greater than or equal to 30 MHz. From the judgment of the insertion loss characteristics of FIG. 4, by further increasing the width W greater than 20 mm, this band can be suppressed.

Figure 5:
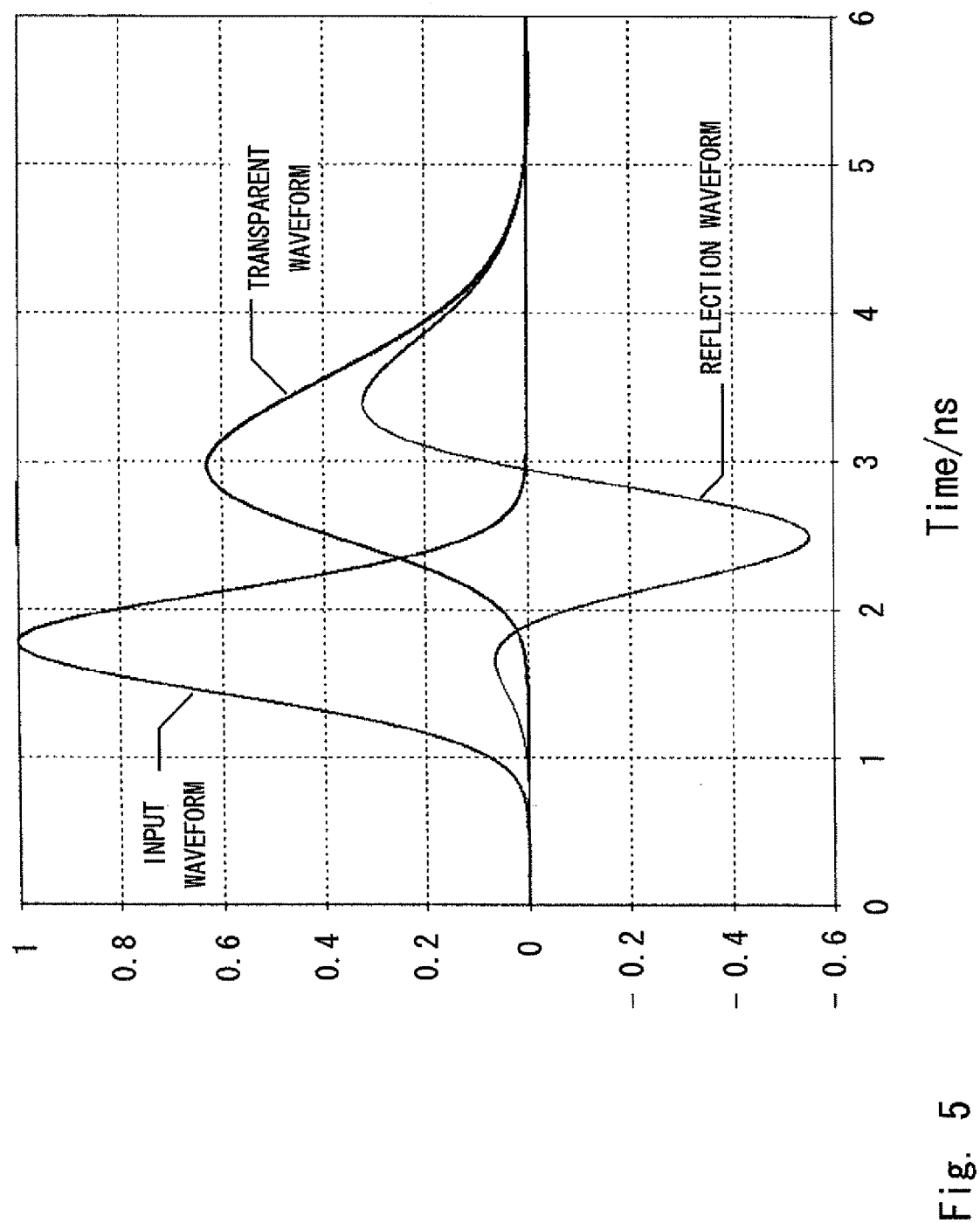
FIG. 5 is a view showing response characteristics when applying a Gaussian pulse in the examples of FIGS. 1 and 2.

FIG. 5 assumes the noise propagating through the feed line according to the present invention, applies a Gaussian pulse, and shows an analysis of the response. It shows that the negative reflection is generated by a low impedance of the part of the floating wire 43, and pass waveform level of the applied Gaussian pulse can be controlled.

Figure 6:
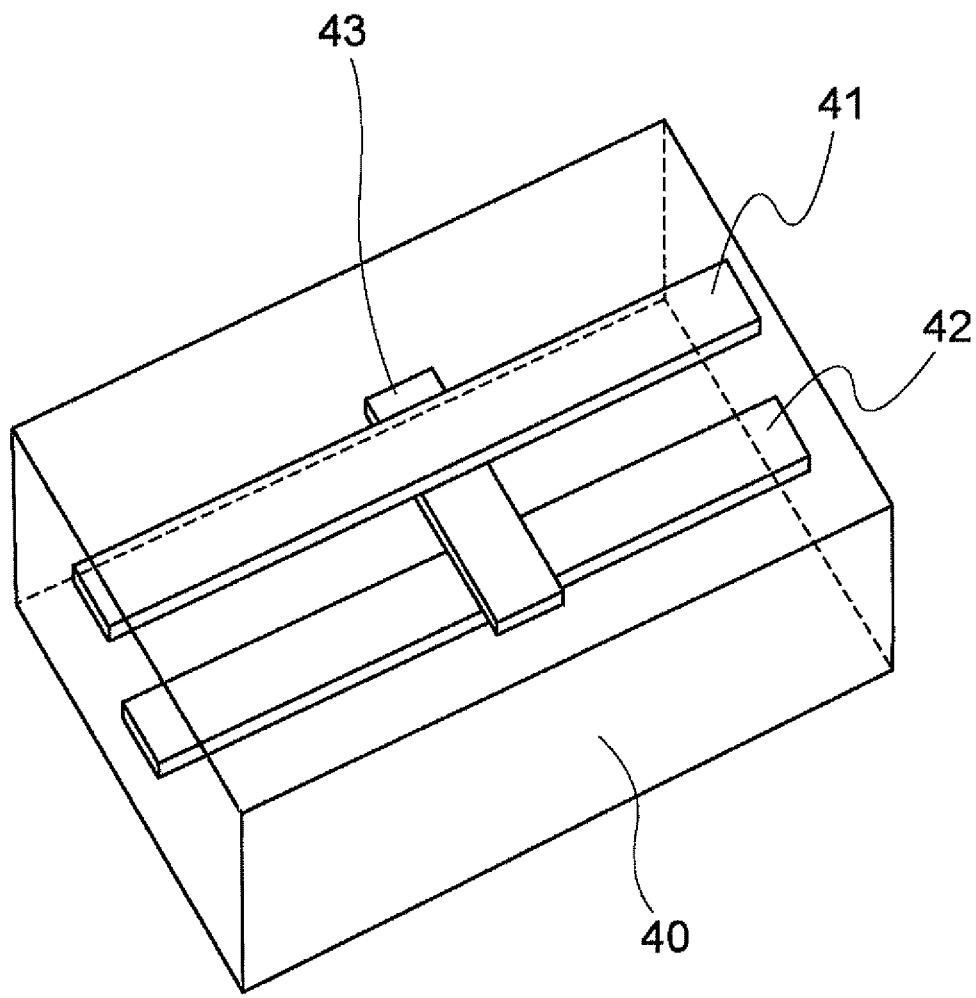
FIG. 6 is a perspective view of a second exemplary embodiment of the present invention.
Figure 7:
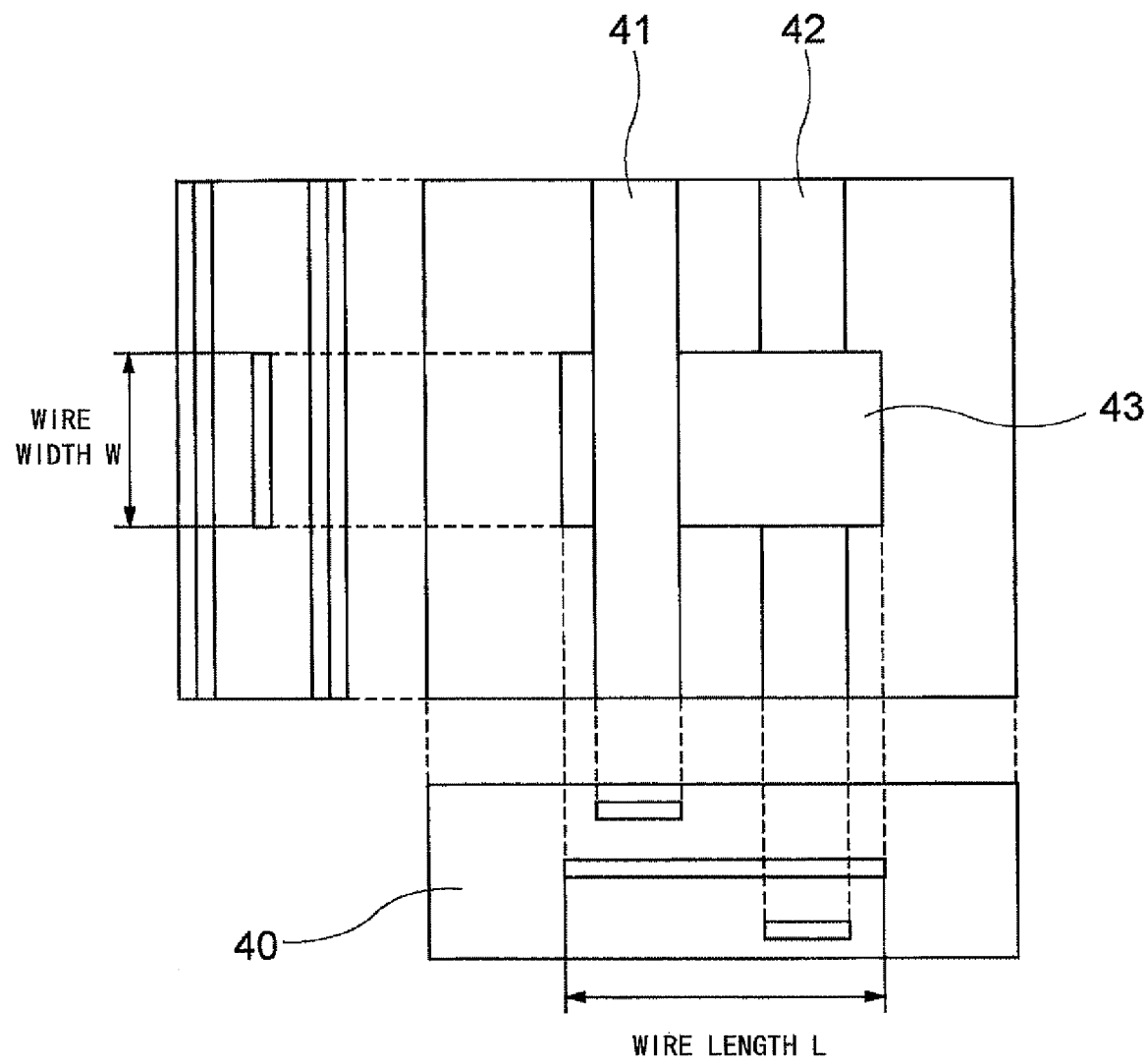
FIG. 7 is a plan view, a front view, and a side view of the second exemplary embodiment of the present invention.

Next, a second exemplary embodiment of the present invention is described with reference to FIGS. 6 and 7. FIG. 6 is a perspective view thereof, and FIG. 7 is a plan view, a front view, and a side view thereof. In FIGS. 6 and 7, identical parts as in FIGS. 1 and 2 are denoted by the same codes.

Note that also in FIGS. 6 and 7, in a similar manner as FIGS. 1 and 2 which show the former exemplary embodiment, a state in which a part of the dielectric 40 as the circuit board is cut off is shown. In this case, in order to understand easily, it is shown that the dielectric 40 is assumed to be a transparency for convenience.

In the former first exemplary embodiment, the power supply wire 41 and the reference potential wire 42 are formed in the same plane in the dielectric 40, however this example shows a case in which the power supply wire 41 and the reference potential wire 42 are formed in different planes (layers) from each other. Also in this case, the floating wire 43 shall be formed to three-dimensionally intersect with both of the power supply wire 41 and the reference potential wire 42.

The order of lamination of each wiring layer in this case is the power supply wire 41, the floating wire 43, and the reference potential wire 42 in order from the top layer, however it is not limited to this.

Note that the floating wire 43 in each of abovementioned exemplary embodiment is explained additionally. The primary side power supply (input side of the onboard power supply 11 of FIG. 8) assumed in the exemplary embodiment of the present invention is a high voltage generally used in a communication device, such as −48 volts. Accordingly, it is necessary to electrically separate from the secondary side electronic circuit 12. From a viewpoint of safety and the prevention of noise inflow, power supply for signals and GND (reference potential) of the electronic circuit cannot be used for this wire 43, therefore it is set a in floating state in potential.

Further, the wire 43 can be grounded to a frame GND of a device housing instead of setting it in the floating state. However, by physical constraints, such as reservation of the wires for grounding to the housing and a connection method to the case, the design is complicated and it is no longer the best plan, thus the simplicity of implementation, which is a purpose of the present invention, cannot be solved.

As described above, by including the floating wire that realizes the low impedance along the primary side feed line, a low pass filter is composed. Then, it is possible to suppress the high frequency noise entering from the electronic circuit of the secondary power supply, and the EMI radiation radiated from the feed cable can be suppressed. Moreover, by including only a simple wiring pattern of the floating state in an electronic circuit board, a filter can be composed and it is possible to realize the reduction in cost in the product development.

Note that as a secondary exemplary advantage of the floating wire, migration is hardly generated between this floating wire and the power supply wire, and the short-circuit between the primary power supply and GND is hardly generated due to a crack of a circuit board or the like.

Although the present invention is explained with reference to the exemplary embodiment, the present invention is not limited by above. Various modifications that can be understood by a person skilled in the art within the scope of the present invention can be made to the configurations and details of the present invention.

The present application claims priority rights of and is based on Japanese Patent Application No. 2009-189633 filed on Aug. 19, 2009 in the Japanese Patent Office, the entire contents of which are hereby incorporated by reference.

REFERENCE SIGNS LIST

1 STATION POWER SUPPLY OR COMMERCIAL POWER SUPPLY
2 EXTERNAL FEED CABLE
3 PRODUCT AND DEVICE
4 ELECTRONIC CIRCUIT BOARD (PRINTED CIRCUIT BOARD)
5 and 9 FILTER CIRCUIT
6 POWER SUPPLY CIRCUIT
7 INTERNAL FEED LINE
8 INTERNAL FEED CONNECTOR
10 PRIMARY SIDE (INPUT SIDE OF POWER SUPPLY) FEED LINE
11 ONBOARD POWER SUPPLY
12 ELECTRONIC CIRCUIT
13 SECONDARY SIDE (OUTPUT SIDE OF POWER SUPPLY) FEED LINE
40 INSULATOR (DIELECTRIC)
41 POWER SUPPLY WIRE
42 REFERENCE POTENTIAL (GND) WIRE
43 FLOATING WIRE

The invention claimed is:

1. A feed line structure comprising:
a power supply wire and a reference potential wire that pair and compose a feed line and are provided in an insulator; and
a floating state wire, which three-dimensionally intersects with both of the power supply wire and the reference potential wire in the insulator, not connected to either the power supply wire or the reference potential wire and in a floating state in potential, the floating state wire having a width of more than 10 mm and less than 20 mm, or a width of more than 20 mm, the floating state wire having a length which overlaps only across the pair of the power supply wire and the reference potential wire, without overlapping across another wire, the floating state wire being unconnected to all other wires.

2. The feed line structure according to claim 1, wherein the power supply wire and the reference potential wire are formed in a same plane, and the floating state wire is formed in a different surface from the same plane.

3. The feed line structure according to claim 1, wherein the wire in the floating state that is formed in the different plane from the power supply wire and the reference potential wire is formed in a different plane from each of the planes.

4. The feed line structure according to claim 1, wherein the feed line is used as a feed line of an input side of a power supply circuit for an electronic circuit provided on the insulator.

* * * * *